United States Patent
Nakazawa et al.

[11] Patent Number: 6,011,312
[45] Date of Patent: Jan. 4, 2000

[54] FLIP-CHIP SEMICONDUCTOR PACKAGE

[75] Inventors: Takahito Nakazawa; Yumiko Ohshima, both of Yokohama, Japan

[73] Assignee: Kabushiki Kaisha Toshiba, Kawasaki, Japan

[21] Appl. No.: 08/902,430

[22] Filed: Jul. 29, 1997

[30] Foreign Application Priority Data

Jul. 30, 1996 [JP] Japan ................................. 8-200290

[51] Int. Cl.[7] .......................... H01L 23/48; H01L 23/04; H01L 23/52
[52] U.S. Cl. .......................... 257/778; 257/793; 257/693; 257/698
[58] Field of Search .................. 257/778, 693, 257/698, 783, 793, 737, 738; 228/180.22

[56] References Cited

U.S. PATENT DOCUMENTS

| | | | |
|---|---|---|---|
| 3,811,183 | 5/1974 | Celling | 257/778 |
| 4,190,855 | 2/1980 | Inoue | 257/778 |
| 5,408,121 | 4/1995 | Nakamura et al. | 257/778 |
| 5,656,857 | 8/1997 | Kishita | 257/778 |
| 5,670,826 | 9/1997 | Bessho | 257/778 |
| 5,726,502 | 3/1998 | Beddingfield | 257/797 |
| 5,729,440 | 3/1998 | Jimarez et al. | 257/779 |
| 5,731,630 | 3/1998 | Suyama et al. | 257/778 |
| 5,737,191 | 4/1998 | Horiuchi et al. | 257/778 |
| 5,773,882 | 6/1998 | Iwasaki | 257/698 |
| 5,814,890 | 9/1998 | Iwasaki | 257/778 |
| 5,814,894 | 9/1998 | Igarashi et al. | 257/787 |
| 5,818,113 | 10/1998 | Iseki et al. | 257/778 |
| 5,864,178 | 1/1999 | Yamada et al. | 257/737 |

FOREIGN PATENT DOCUMENTS 1-143346   6/1989   Japan ................................. 257/778

*Primary Examiner*—Mahshid Saadat
*Assistant Examiner*—Jhihan B Clark
*Attorney, Agent, or Firm*—Loeb & Loeb, LLP

[57] ABSTRACT

A semiconductor package is provided that includes a semiconductor chip that is mounted on a mount board with metal bumps interposed therebetween so as to create a gap. A structure is provided in the gap for limiting the flow of a resin, which is deposited along side the semiconductor chip, around the peripheral portion of the semiconductor chip. The structure increases the resistance to the flow of the resin in the peripheral portion of the semiconductor chip. Therefore, the rate at which the resin flows in the peripheral portion of the semiconductor chip is made lower than the rate at which the resin flows near the central portion of semiconductor chip. Accordingly, the formation of a resin-less void in the gap is suppressed so that the grade and quality of the semiconductor device is improved. In one embodiment, the structure in the gap includes projections provided on a portion of the mount board that corresponds to the peripheral portion of the semiconductor chip. In another embodiment, the structure in the gap includes protruding, portions provided on portions of the mount board that correspond to side portions of the semiconductor chip. The protruding portions make the size of the gap near the central portion of the semiconductor chip larger than size of the gap near the side portions of the semiconductor chip.

5 Claims, 6 Drawing Sheets

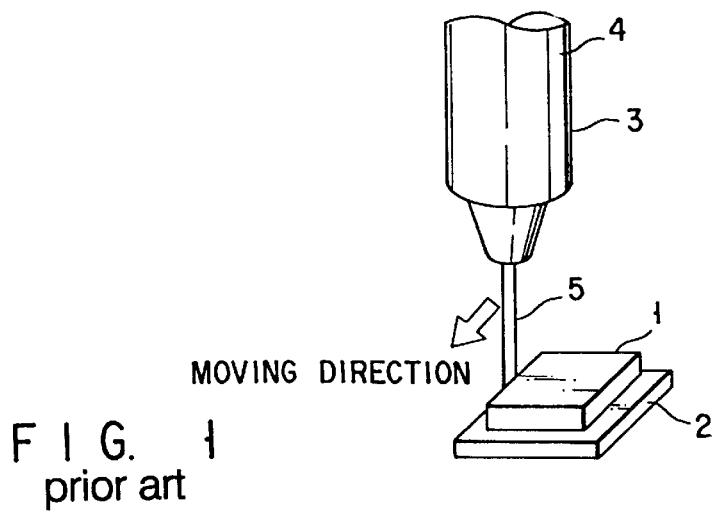
FIG. 1
prior art
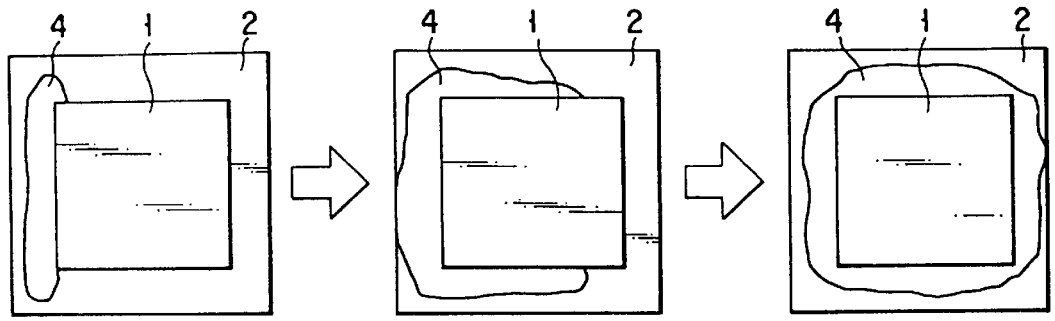
FIG. 2A
prior art
FIG. 2B
prior art
FIG. 2C
prior art
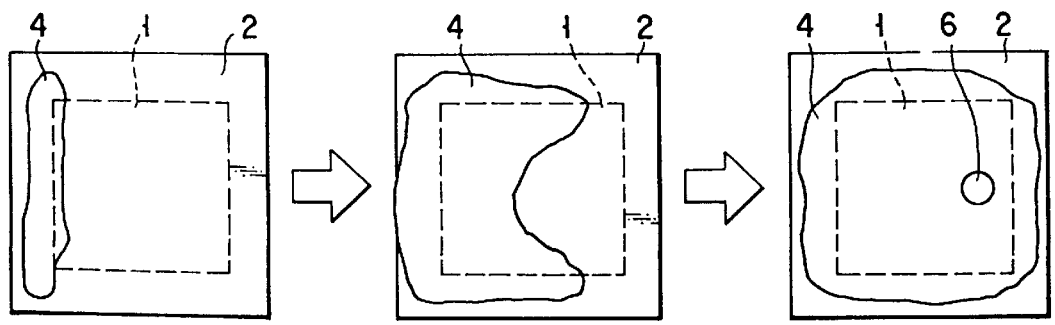
FIG. 3A
prior art
FIG. 3B
prior art
FIG. 3C
prior art

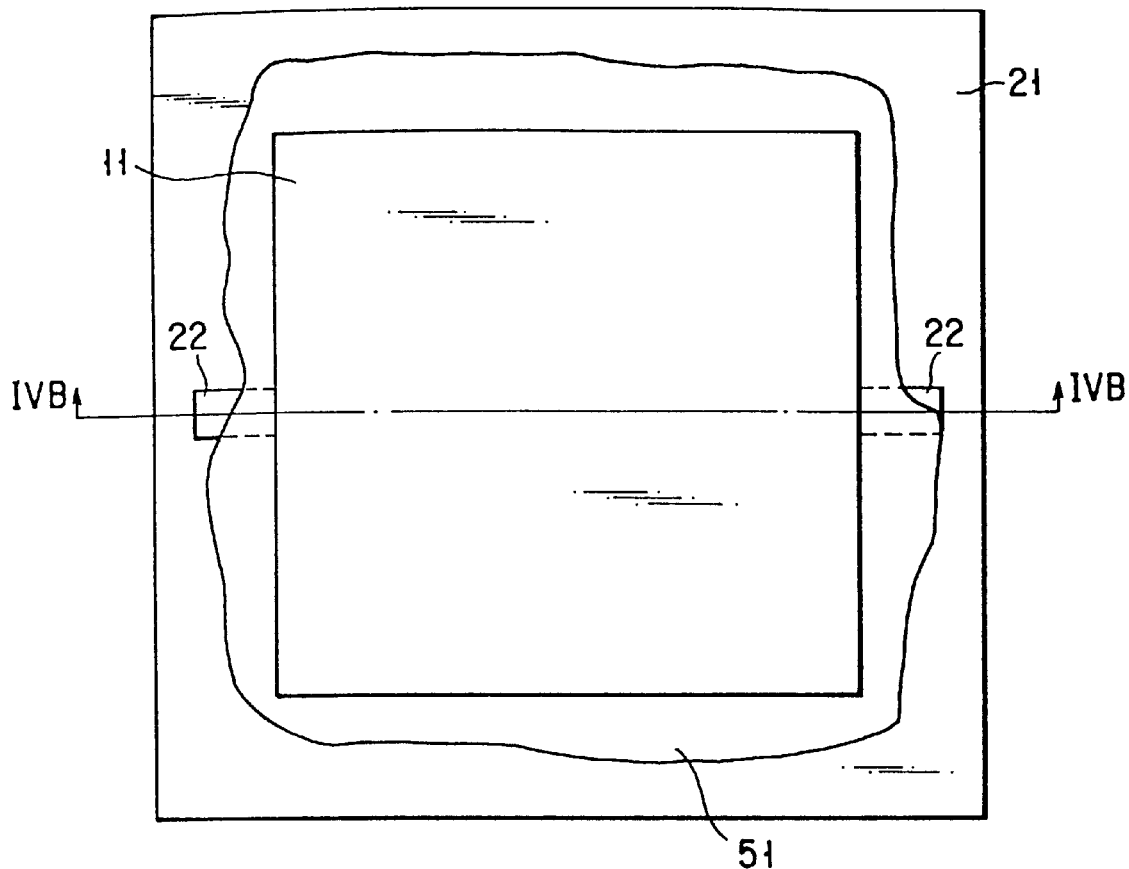
F I G. 4A
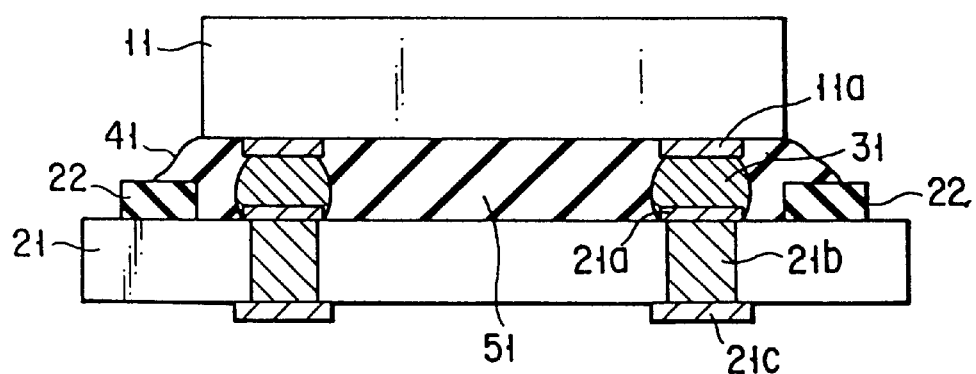
F I G. 4B

FLIP-CHIP SEMICONDUCTOR PACKAGE

FIELD OF THE INVENTION

The present invention relates to a flip-chip-type semiconductor package, and more specifically to a semiconductor package in which formation of a resin-less void in the gap between the semiconductor chip and a mount board is suppressed, so that the grade and quality of the semiconductor device is improved.

BACKGROUND OF THE INVENTION

There has recently been developed a "flip-chip" method for packaging semiconductor chips. The flip-chip method produces a small semiconductor package in which a semiconductor chip is bonded to a mount board. Typically, solder bumps are formed on the electrode pads of the semiconductor chip, and the solder bumps are connected to the pads and wiring of the mount board. A resin is filled in a gap between the semiconductor chip and the mount board to secure the package. FIG. 1 shows a conventional method of fabricating a semiconductor package that has a semiconductor chip and a mount board connected in a flip-chip manner with a resin filled in the gap between the semiconductor chip and the mount board. As shown, a semiconductor chip 1 is flip-chip-connected to a mount board 2, and a syringe 3 is moved along one side of the semiconductor chip 1 in the direction indicated by the arrow in the figure.

As the syringe is moved along the chip, a resin 4 contained in the syringe 3 is fed (i.e., potted) from the distal end of a nozzle 5. Ideally, the resin 4 would gradually fill the entire gap between the semiconductor chip 1 and mount board 2 by virtue of a capillary phenomenon, as shown in FIGS. 2A to 2C. However, the rate at which the resin enters the gap between the chip and mount board is typically lower than the rate at which the resin advances around the periphery of the semiconductor chip. Thus, using the conventional method, it is difficult to completely fill the gap between the semiconductor chip and the mount board.

FIGS. 3A to 3C show see-through views of the semiconductor chip to illustrate how the resin typically enters the gap between the semiconductor chip and mount board when the conventional method is used. Initially, as shown in FIG. 3A, a resin 4 is deposited along one side of the semiconductor chip 1. The mount board 2 has a substantially flat surface and a substantially uniform in-plane temperature distribution, so the rate at which the resin enters the gap is lower than the rate at which the resin advances around the periphery of the semiconductor chip, as shown in FIG. 3B. Consequently, the resin may fail to completely fill the gap, and instead enclose air (or peripheral atmosphere) so that a void 6 is formed, as shown in FIG. 3C. The void 6 lowers the grade and quality of the semiconductor device because it can lead to defects or cracks. More specifically, moisture entering the void can deteriorate the solder bridge, short-circuit the wiring elements on the mount board, or crack the semiconductor device.

As explained above, when the conventional method is used, resin-less voids tend to form in the gap between the semiconductor chip and the mount board, and thus the grade and quality of the resultant semiconductor device are lowered.

SUMMARY OF THE INVENTION

In view of these problems, it is an object of the present invention to remove the above-mentioned drawbacks and to provide a semiconductor package in which formation of resin-less voids is deterred so that the grade and quality of the semiconductor device is improved. To achieve this object, one preferred embodiment of the present invention provides a structure for limiting the flow of the resin, which is deposited along side the semiconductor chip, around the peripheral portion of the chip. Accordingly, in the semiconductor package of this embodiment, the resistance to the flow of the resin in the peripheral portion of the semiconductor chip is increased. Therefore, the rate at which the resin flows in the peripheral portion of the semiconductor chip is made lower than the rate at which the resin flows near the central portion of semiconductor chip.

In another preferred embodiment of the present invention, the object is achieved by providing a structure for increasing the flow of the resin in the central portion of the chip. Accordingly, in the semiconductor package of this embodiment, the resistance to the flow of the resin in the central portion of the semiconductor chip is decreased. Thus, the rate at which the resin flows in the peripheral portion of the semiconductor chip is made lower than the rate at which the resin flows near the central portion of semiconductor chip.

According to one embodiment of the present invention, a semiconductor package is provided that includes a semiconductor chip and a mount board. The semiconductor chip is mounted on the mount board with metal bumps interposed therebetween so as to create a gap, and at least one projection is provided on a portion of the mount board that corresponds to a peripheral portion of the semiconductor chip. The projection prevents a resin, which is to be filled in the gap between the semiconductor chip and the mount board, from advancing around the peripheral portion of the semiconductor chip. In a preferred embodiment, the projection is formed by a resin and is located midway along the semiconductor chip in the direction in which the resin advances through the gap.

According to another embodiment of the present invention, a semiconductor package is provided that includes a semiconductor chip and a mount board. The semiconductor chip is mounted on the mount board with metal bumps interposed therebetween so as to create a gap, and at least one protruding portion is provided on a portion of the mount board that corresponds to a side portion of the semiconductor chip. The protruding portion makes the size of the gap near the central portion of the semiconductor chip larger than size of the gap near the side portion of the semiconductor chip in order to prevent a resin, which is to be filled in the gap between the semiconductor chip and the mount board, from more quickly advancing through a portion of the gap near the side portion of the semiconductor chip.

According to yet another embodiment of the present invention, a semiconductor package is provided that includes a semiconductor chip, which has electrodes arranged along at least one of its sides, and a mount board. The semiconductor chip is mounted on the mount board with metal bumps interposed between the electrodes of the semiconductor chip and the mount board so as to create a gap, and a resin is deposited along one side of the semiconductor chip in order to fill the gap. Additionally, the electrodes are arranged on the semiconductor chip such that the electrodes and metal bumps prevent the resin from advancing through a portion of the gap adjacent to a side portion of the semiconductor chip more quickly than through a portion of the gap adjacent to a central portion of the semiconductor chip. In a preferred embodiment, the electrodes are arranged such that along the side of the semiconductor chip along which the resin is deposited, the pitch of the electrodes in a central portion of the semiconductor chip is more than the pitch of the electrodes in an end portion of the semiconductor chip.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the scope of the present invention.

BRIEF DESCRIPTION OF THE DRAWINGS

FIG. 1 is a view showing a conventional method of fabricating a semiconductor package;

FIGS. 2A to 2C are views illustrating how the resin should fill the gap between the semiconductor chip and the mount board;

FIGS. 3A to 3C are see-through views of the semiconductor chip illustrating how the resin enters the gap in the conventional method;

FIGS. 4A and 4B are views showing the structure of a semiconductor package according to a first embodiment of the present invention;

DETAILED DESCRIPTION OF PREFERRED EMBODIMENTS

Figure 5A:
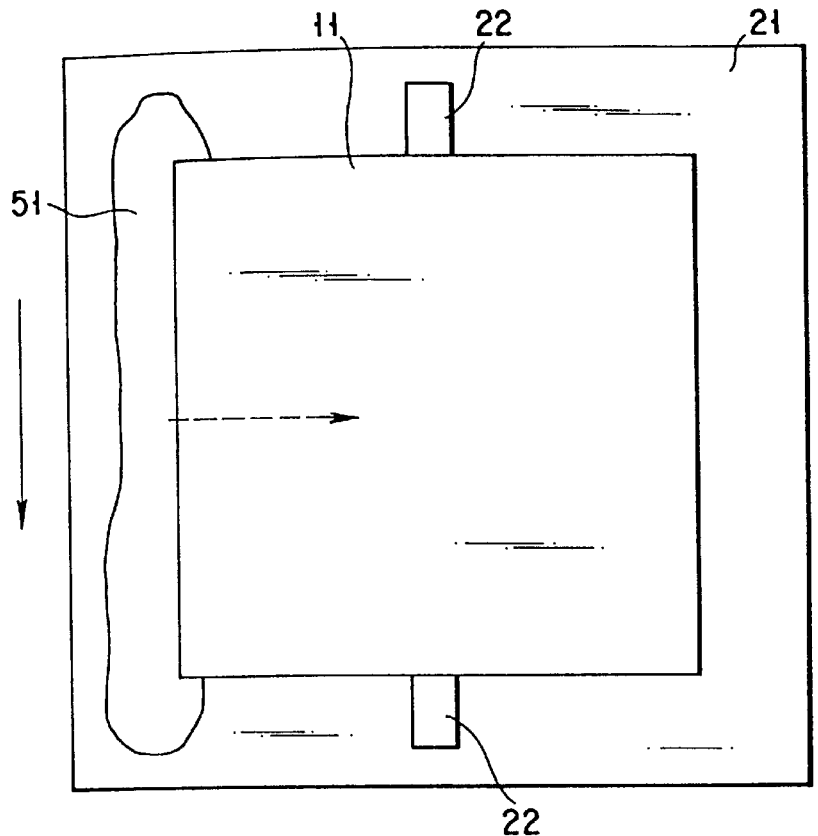
FIGS. 5A and 5B are views showing a preferred method of fabricating the semiconductor package of the first embodiment of the present invention.

Preferred embodiments of the present invention will be described in detail hereinbelow with reference to the attached drawings.

FIGS. 4A and 4B show the structure of a semiconductor package according to a first embodiment of the present invention. FIG. 4A is a top view of the semiconductor package, and FIG. 4B is a cross-sectional view taken along line IVB—IVB of FIG. 4A. The semiconductor package includes a semiconductor chip 11 that is flip-chip-connected to a mount board 21 by means of metal bumps 31 (e.g., solder bumps). A sealing resin 51 is filled in a gap 41 between the semiconductor chip 11 and mount board 21. In more detail, the semiconductor chip 11 is provided with electrode pads 11a that are located, for example, along side portions of the chip. The metal bumps 31 are provided on the electrode pads 11a, and wiring pads 21a are provided on the surface of the mount board 21 at positions corresponding to the electrode pads 11a of the semiconductor chip 11. The wiring pads 21a are led out of the bottom surface of the mount board 21 via through-holes 21b and are connected to external electrodes 21c that are arranged, for example, in a matrix. The mount board is typically formed with materials such as epoxy resin, alumina ($Al_2O_3$), aluminum nitride (AlN), and/or silicon carbide (SiC).

Additionally, projections 22 are provided on the surface of the mount board 21 at positions corresponding to the peripheral portion of the semiconductor chip 11. In a preferred embodiment, the projections 22 are formed of a resist and are located midway along the chip in the direction in which the resin 51 advances through the gap between the mount board 21 and semiconductor chip 11. Thus, the projections obstruct the flow of the resin around the periphery of the semiconductor chip. In further embodiments, the projections are formed by making use of a portion of the circuit that is formed on the mount board, and are located at one or more positions along the periphery of the semiconductor chip in the direction of advancement of the resin. The resin is a most general epoxy resin that is deposited on the mount board along one side of the semiconductor chip, and the resin fills the gap by virtue of a capillary phenomenon.

Figure 5B:
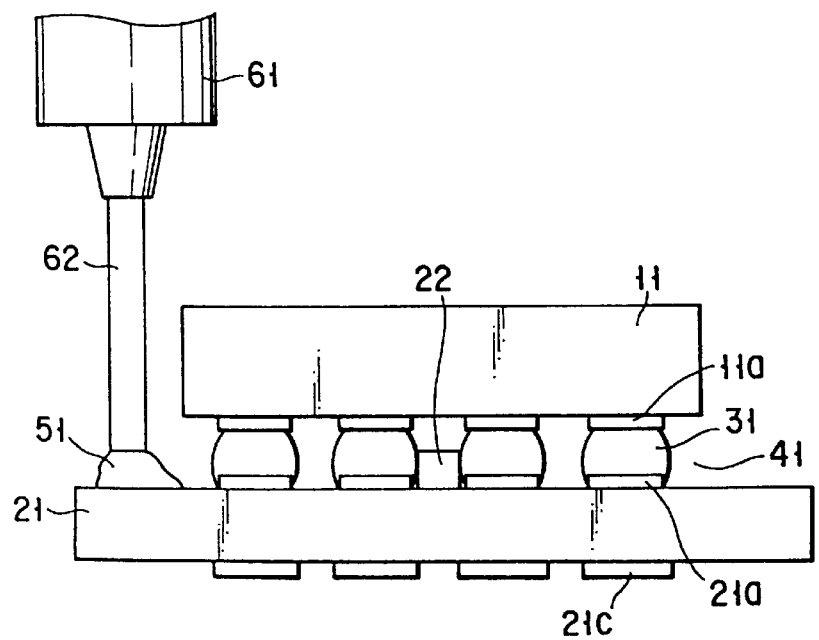

FIGS. 5A and 5B show a preferred method of fabricating the semiconductor package of the first embodiment of the present invention. FIG. 5A is a top view illustrating the supply of the resin 51, and FIG. 5B is a side view of the same. After the semiconductor chip 11 is flip-chip-connected to the mount board 21, a syringe 61 is moved along one side of the semiconductor chip 11 in the direction indicated by the solid arrow in FIG. 5A. As the syringe is moved along the chip, the resin 51 contained in the syringe 61 is supplied from the distal end of a nozzle 62 to one end portion of the mount board 21. The resin 51 deposited on the mount board 21 gradually advances from the left to the right of the mount board by virtue of the capillary phenomenon, as shown by the broken arrow in FIG. 5A. Eventually, the resin completely fills the gap between the semiconductor chip and the mount board.

Figure 6A:
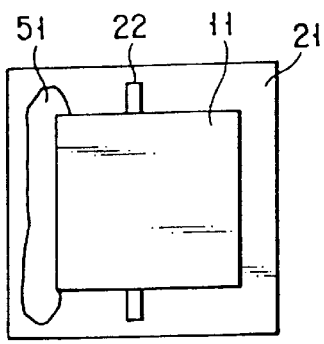
FIGS. 6A to 6C are views illustrating how the resin enters the gap between the semiconductor chip and the mount board in the method of FIGS. 5A and 5B.
Figure 6B:
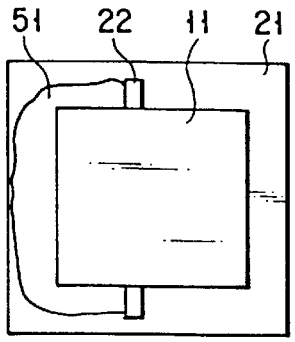
Figure 6C:
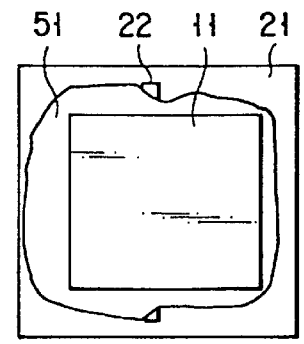

FIGS. 6A to 6C illustrate in more detail how the resin completely fills the gap between the semiconductor chip and mount board. As the resin 51 deposited on the mount board 21 is entering the gap, the projections 22 prevent the resin 51 from advancing around the periphery of the semiconductor chip 11. More specifically, the projections function as resistance to the flow of the resin in the peripheral portion of the chip, and thus the rate of flow of the resin in the peripheral portion of the chip is decreased. On the other hand, the flow of the resin is not obstructed in the central portion of the semiconductor chip. Consequently, the rate of flow of the resin in the peripheral portion of the semiconductor chip is made lower than the rate of flow near the central portion of chip. Thus, the flow of the resin around the periphery of the semiconductor chip is limited.

Figure 7A:
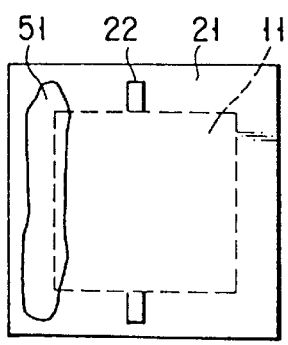
FIGS. 7A to 7C are see-through views of the semiconductor chip illustrating how the resin enters the gap in the method of FIGS. 5A and 5B.
Figure 7B:
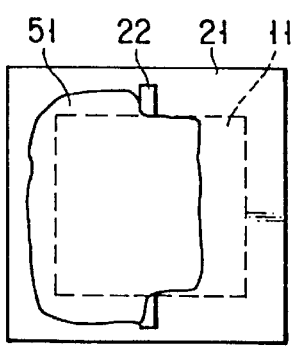
Figure 7C:
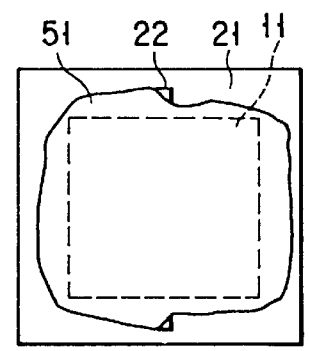

FIGS. 7A to 7C show see-through views of the semiconductor chip to illustrate how the resin enters the gap between the semiconductor chip and mount board. As explained above and shown in the figures, the projections 22 prevent the resin 51 from in advancing around the periphery of the semiconductor chip 11 as the gap 41 is completely filled with the resin flowing in the central portion of the chip. Thus, it is possible to prevent the resin from enclosing air (or peripheral atmosphere) and forming a resin-less void. In other words, the gap between the semiconductor chip and mount board is completely filled with the resin, and thus the chance of defects in the resultant semiconductor device is decreased.

As explained above, in the first embodiment of the present invention, the resistance to the flow of the resin is increased in the peripheral portion of the semiconductor chip. In particular, projections, which prevent the resin from advancing around the periphery of the semiconductor chip, are provided on the portion of the mount board that corresponds to the peripheral portion of the chip midway along the chip in the direction of advancement of the resin. Thus, the rate of flow of the resin in the peripheral portion of the semiconductor chip is made lower than the rate of flow near the central portion of the chip. As a result, the resin is prevented from quickly advancing around the periphery of the semiconductor chip and enclosing air before the gap is completely filled with resin, so a high-grade, high-quality semiconductor package with no resin-less void is obtained.

In the embodiments described above, the electrode pads are arranged only on the side portions of the semiconductor chip, and projections are provided to prevent the resin from advancing around the periphery of the semiconductor chip. However, in further embodiments of the present invention, electrode pads are arranged in a matrix on the entire surface of the semiconductor chip. In such embodiments, the advantages of the present invention can be obtained by making the gap near the central portion of the chip greater than the gap near the side portions of the chip, or by controlling the pitch of the electrode pads on the semiconductor chip to have a similar affect on the flow of the resin. The "pitch" of the pads refers to the spacing between pads, with a fine or narrow pitch indicating closely-spaced pads (i.e., high pad density).

Figure 8A:
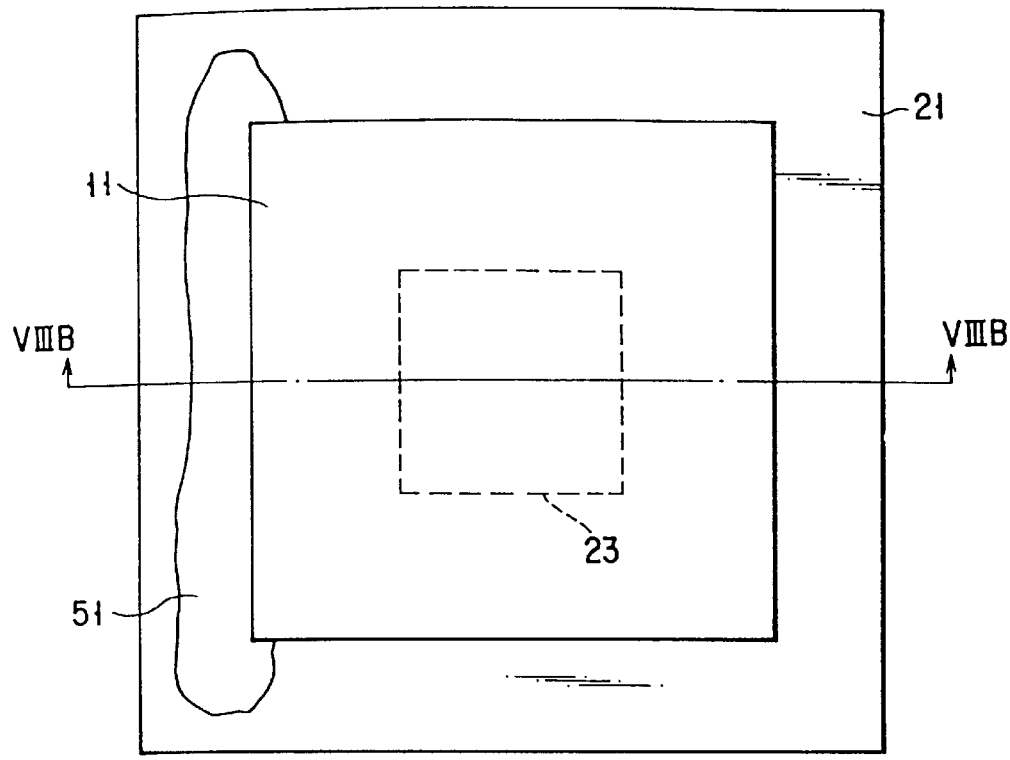
FIGS. 8A and 8B are views showing a method of fabricating a semiconductor package according to a second embodiment of the present invention.
Figure 8B:
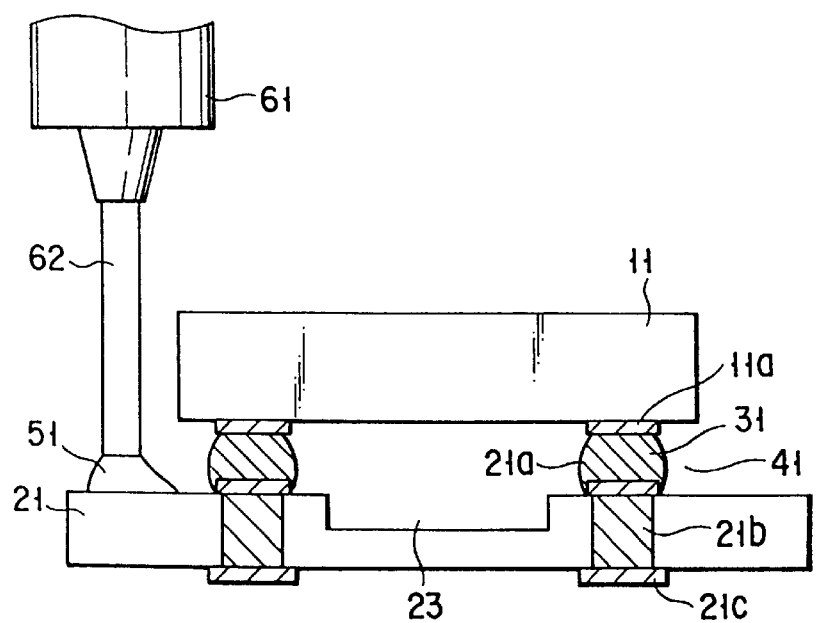

FIGS. 8A and 8B show a method of fabricating a semiconductor package according a second embodiment of the present invention. FIG. 8A is a top view illustrating the supply of the resin, and FIG. 8B is a cross-sectional view taken along line VIIIB—VIIIB of FIG. 8A. In the second embodiment, a recess (i.e., cavity) 23 is formed in the portion of the mount board 21 that corresponds to the central portion of the semiconductor chip 11. Therefore, protruding portions are formed on those portions of the mount board 21 that correspond to the side portions of the semiconductor chip 11. The protruding portions prevent the resin 51, which is deposited along one side of the semiconductor chip, from more quickly advancing around the periphery and side portions of the semiconductor chip 11.

More specifically, at any point, the rate of flow of the resin is substantially proportional to the size of the gap between the semiconductor chip and mount board. This can be explained by capillary pressure and pressure loss, which are respectively given by the following approximate formulas.

$$P = -\frac{2T\cos\theta}{H} \quad (1)$$

$$\frac{dP}{dX} = -uF\eta \quad (2)$$

Figure 9:
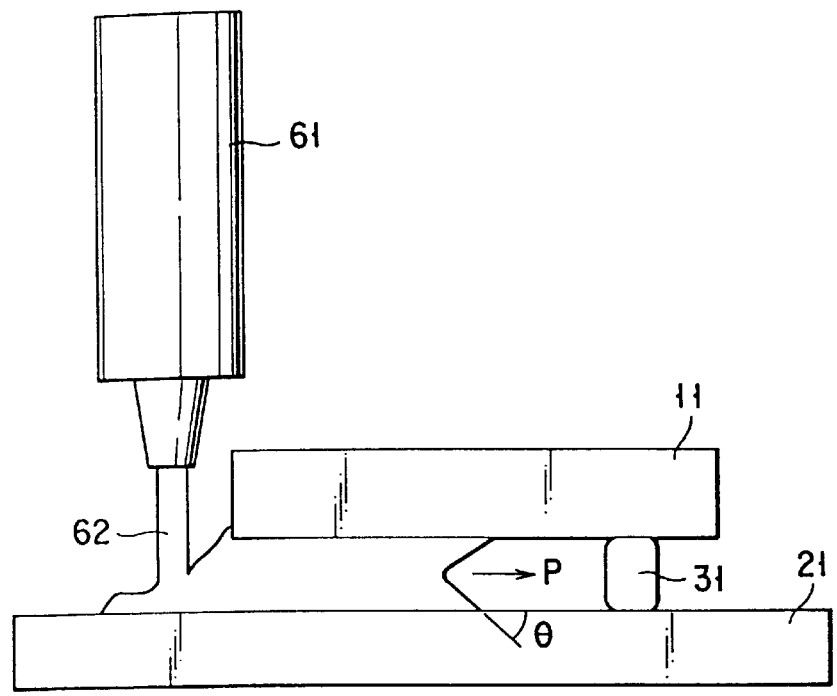
FIG. 9 is a view for explaining capillary pressure in the gap between the semiconductor chip and the mount board.

In these two equations, P is the capillary pressure, T is the surface tension, θ is the contact angle, H is the gap, η is the viscosity of the resin, u is the flow velocity, and F is the flow resistance (see FIG. 9). Thus, the wider the gap, the faster the flow rate. Because the recess 23 is formed in the mount board 21 to make the gap near the central portion larger than gap near the side portions of the chip, the rate of flow of the resin near the central portion is higher than the rate of flow near the side portions of the chip. In this manner, the second embodiment can obtain the same advantages as the first embodiment, in which the resistance to the flow of the resin in the peripheral portion of the semiconductor chip was increased. Accordingly, the second embodiment prevents the resin from quickly advancing around the periphery and sides of the semiconductor chip and enclosing air before the gap is completely filled with resin, so a high-grade, high-quality semiconductor package with no resin-less void is obtained.

In the second embodiment, if a semiconductor chip having electrode pads arranged in a matrix on the entire surface of the chip is to be mounted, additional wiring pads are provided within the recess in the mount board. The wiring pads within the recess are connected to the corresponding electrode pads of the semiconductor chip by using metal bumps that are higher (i.e., longer) than the metal bumps corresponding to wiring pads located outside of the recess. Further, in the embodiments described above, a cavity is formed in the portion of the mount board that corresponds to the central portion of the semiconductor chip. However, in further embodiments, the portion of the mount board that corresponds to the side portions of the semiconductor chip can be protruded by thickening those portions of the mount board.

Figure 10:
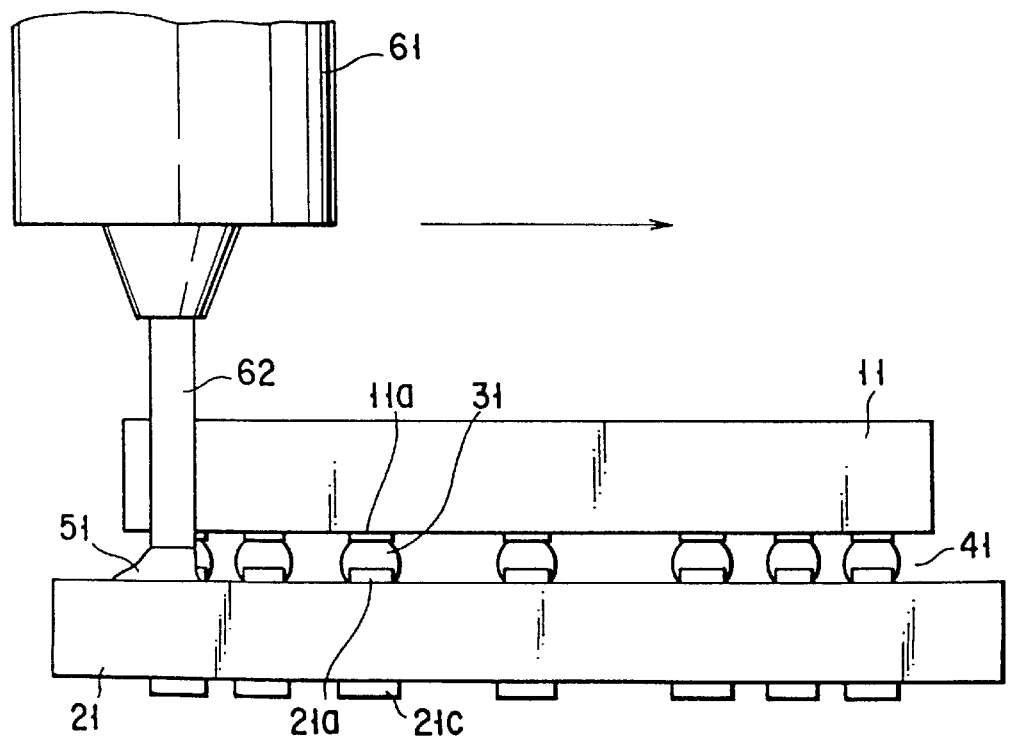
FIG. 10 is a view showing a method of fabricating a semiconductor package according to a third embodiment of the present invention.

FIG. 10 shows a method of fabricating a semiconductor package according to third embodiment of the present invention. In the third embodiment, the electrode pads 11a are provided along one side of the semiconductor chip 11, and the pitch of the electrode pads is controlled in the direction of movement of the syringe 61, as shown by the arrow in the figure. More specifically, the electrode pads 11a are arranged to have a pitch that decreases when moving from the central portion towards an end portion of the semiconductor chip. In other words, the pitch of electrode pads 11a is controlled such that the density of metal bumps 31 in the gap 41 is low near the central portion of the chip and high near the side portions of the chip (in the direction of movement of the syringe).

Such an arrangement prevents the resin 51, which is deposited along one side of the semiconductor chip, from more quickly advancing around the periphery and side portions of the semiconductor chip 11. This is because the flow resistance is given by the following formula.

$$F = (1 - \text{Size}/\text{Pitch})^{-0.7} \quad (3)$$

In equation 3, F is the flow resistance, "Size" is the diameter of the metal bumps, and "Pitch" is the space between the bumps. Therefore, the resistance to the flow of the resin is increased near the side portions of the semiconductor chip so that the rate of flow of the resin near the peripheral portion of the chip is lower than the rate of flow near the central portion of the chip. For example, if the pitch of the metal bumps near the side portions of the chip is 200 to 300 μm, the pitch of the metal bumps near the central portion of the chip is made to be about 80 to 100 μm greater than the pitch near the side portions. Thus, the flow resistance is higher near the side portions of the chip so the resin flows more quickly near the central portion. Accordingly, the third embodiment prevents the resin from quickly advancing around the periphery and sides of the semiconductor chip and enclosing air before the gap is completely filled with resin, so a high-grade, high-quality semiconductor package with no resin-less void is obtained.

In the embodiments described above, the electrode pads are arranged only on the side portions of the semiconductor chip. However, in further embodiments, electrode pads are arranged in a matrix on the entire surface of the semiconductor chip. In such embodiments, the advantages of the present invention can be obtained by controlling the pitch of the electrode pads such that the density of the metal bumps is low near the central portion of the semiconductor chip and high near the side portions of the chip (in the direction of movement of the syringe).

As described above, the present invention provides a semiconductor package in which formation of a resin-less void is suppressed so that the grade and quality of the semiconductor device is improved.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A semiconductor package comprising:
   a semiconductor chip, electrodes being arranged along at least one side of the semiconductor chip; and
   a mount board, the semiconductor chip being mounted on the mount board with metal bumps interposed between the electrodes of the semiconductor chip and the mount board so as to create a gap,
   wherein a resin is deposited along one side of the semiconductor chip in order to fill the gap between the semiconductor chip and the mount board with the resin, and
   the electrodes are arranged on the semiconductor chip such that the electrodes and metal bumps impede advancement of the resin through a portion of the gap adjacent to a side portion of the semiconductor chip, so that the resin advances through a portion of the gap adjacent to a central portion of the semiconductor chip more quickly than through the portion of the semiconductor chip more quickly than through the portion of the gap adjacent to the side portion of the semiconductor chip, wherein the electrodes are arranged such that when going along the one side of the semiconductor chip along which the resin is deposited, the pitch of the electrodes in a central portion of the semiconductor chip is greater than the pitch of the electrodes in an end portion of the semiconductor chip.

2. A semiconductor package comprising:
   a semiconductor chip; and
   a mount board,
   wherein a resin is deposited on the mount board along one side of the semiconductor chip in order to fill a gap between the semiconductor chip and the mount board with the resin, and
   the semiconductor package includes a structure provided in the gap for limiting the flow of the resin, which is deposited along one side of the semiconductor chip, around the peripheral portion of the semiconductor chip,
   wherein the structure provided in the gap includes projections that are located on a portion of the mount board that corresponds to the peripheral portion of the semiconductor chip, and
   wherein the distance from the projections to the semiconductor chip defines a space smaller than the gap from the mount board to the semiconductor chip.

3. A semiconductor package comprising:
   a semiconductor chip;
   a mount board;
   a resin deposited on the mount board along one side of the semiconductor chip in order to fill a gap between the semiconductor chip and the mount board with the resin; and
   means for increasing the flow of the resin near a central portion of the semiconductor chip relative to peripheral portions of the semiconductor chip, so that the rate at which the resin flows in the peripheral portions of the semiconductor chips is made lower than the rate at which the resin flows near the central portion of the semiconductor chip,
   wherein the distance from the projections to the semiconductor chip defines space smaller than the gap from the mount board to the semiconductor chip.

4. A semiconductor package comprising;
   a semiconductor chip;
   mount board, the semiconductor chip being mounted on the mount board with metal bumps interposed therebetween so as to create a gap; and
   at least one projection provided on a portion of the mount board that corresponds to a peripheral portion of the semiconductor chip,
   wherein the projection impedes advancement of a resin, which is to be filled in the gap between the semiconductor chip and the mount board, around the peripheral portion of the semiconductor chip, and
   wherein the distance from the protrusions to the semiconductor chip defines a space smaller than the gap from the mount board to the semiconductor chip.

5. A semiconductor package comprising:
   a semiconductor chip;
   a mount board, the semiconductor chip being mounted on the mount board with metal bumps interposed therebetween so as to create a gap; and
   at least one protruding portion provided on a portion of the mount board that corresponds to a side portion of the semiconductor chip,
   wherein the protruding portion extends partially across the gap toward the side portion of the semiconductor chip to reduce the gap near the side portion of the semiconductor chip, to impede flow of a resin, which is to be filled in the gap between the semiconductor chip and the mount board, such that the resin advances through a portion of the gap near the central portion of the semiconductor chip more quickly than through a portion of the gap near the side portion of the semiconductor chip,
   wherein the distance from the protrusions to the semiconductor chip defines a space smaller than the gap from the mount board to the semiconductor chip.

* * * * *